(12) United States Patent
Schönecker et al.

(10) Patent No.: US 8,225,480 B2
(45) Date of Patent: Jul. 24, 2012

(54) METHOD AND DEVICE FOR PRODUCING METAL PANELS WITH A PATTERN

(75) Inventors: Axel Georg Schönecker, Alkmaar (NL); Eelko Gelbert Hoek, Santpoort-Noord (NL); Astrid Gutjahr, Julianedorp (NL); Leonardus Jacobus Laas, Alkmaar (NL)

(73) Assignee: RGS Development B.V., Le Petten (NL)

( * ) Notice: Subject to any disclaimer, the term of this patent is extended or adjusted under 35 U.S.C. 154(b) by 952 days.

(21) Appl. No.: 12/091,802

(22) PCT Filed: Oct. 27, 2006

(86) PCT No.: PCT/NL2006/050267
§ 371 (c)(1),
(2), (4) Date: Jul. 15, 2008

(87) PCT Pub. No.: WO2007/049964
PCT Pub. Date: May 3, 2007

(65) Prior Publication Data
US 2008/0286599 A1 Nov. 20, 2008

(30) Foreign Application Priority Data
Oct. 27, 2005 (NL) ...................................... 1030285

(51) Int. Cl.
*B21B 1/46* (2006.01)
*B32B 3/30* (2006.01)
*B22D 29/00* (2006.01)
(52) U.S. Cl. ........................ 29/527.1; 428/573; 164/69.1
(58) Field of Classification Search .................. 29/527.1, 29/527.2, 458, 426.1, 426.3, 426.5, 239; 428/573, 596; 164/69.1, 335, 465; 117/27
See application file for complete search history.

(56) References Cited

U.S. PATENT DOCUMENTS
4,212,343 A * 7/1980 Narasimhan .................. 164/465
(Continued)

FOREIGN PATENT DOCUMENTS
DE 3210403 9/1983
(Continued)

OTHER PUBLICATIONS

Hahn G et al., "12.5% efficient RGS silicon solar cells with carrier collecting channels", Proceedings of the 17th european photovoltaic solar energy conference, Munich, Oct. 22, 2001, pp. 1371-1374, vol. 2 of 3.

(Continued)

*Primary Examiner* — John C Hong
(74) *Attorney, Agent, or Firm* — Howard & Howard Attorneys PLLC

(57) ABSTRACT

A device and method for producing metal panels. First a metal melt is produced, then a substrate, having a lower temperature than the metal melt, is contacted with it so that some of the metal melt crystallizes on the substrate. The substrate is then moved relative to the metal melt so that a metal foil is formed on the substrate. The metal foil is divided into metal panels. The substrate has grooves which are used to fit partitions between the panels, and grooves which are filled with liquid metal. The latter grooves provide a reinforcement for the metal panels. A pattern of recesses and/or elevations can be provided in the substrate so that the same pattern is formed in the metal foil. The pattern may include parallel grooves which ensure that the surface of the foil is enlarged. In the case of solar cells this results in greater efficiency.

22 Claims, 6 Drawing Sheets

U.S. PATENT DOCUMENTS

| | | | |
|---|---|---|---|
| 4,305,776 A | 12/1981 | Grabmaier et al. | |
| 5,298,109 A * | 3/1994 | Knauth et al. | 117/27 |

FOREIGN PATENT DOCUMENTS

| | | |
|---|---|---|
| EP | 0016905 | 10/1980 |
| EP | 0229031 | 7/1987 |
| EP | 0497148 | 8/1992 |
| JP | 63064909 | 3/1988 |
| JP | 05024981 | 2/1993 |
| JP | 2001206798 | 7/2001 |

OTHER PUBLICATIONS

International search report in corresponding PCT/NL2006/050267.

* cited by examiner

METHOD AND DEVICE FOR PRODUCING METAL PANELS WITH A PATTERN

BACKGROUND OF THE INVENTION

1. Field of the Invention

The invention relates to a method for producing metal panels.

2. Description of the Related Art

Such a method is generally known. An example of such a method is the foil drawing method known as Ribbon Growth on Substrate (RGS). Here a casting frame is filled with liquid silicon, for example, and a substrate band is used which is driven so that a surface of a substrate band comes into contact with the metal melt, where the casting frame remains in a certain position and the substrate band passes underneath the casting frame. On the side of the casting frame from which the substrate band leaves the casting frame, a crystallised metal foil escapes at this point. This foil is divided into pieces, which pieces can serve as a basis for producing solar cells, for example.

It is known that structures may be installed in the surface of a solar cell in order to reduce the reflection of the incident light on the surface. One example of this is 15 achieved by providing grooves so that the surface of the solar cell is increased, thereby increasing the efficiency of the solar cell.

Patent publication U.S. Pat. No. 5,704,992 describes a method in which V-shaped grooves in a foil are ground by means of a special saw blade. The saw blade has a pointed profile and rotates at high speed. According to the publication U.S. Pat. No. 4,608,451, a structure is also installed in the surface of a metal foil. In the latter publication grooves are etched into the foil. A certain mask is fitted on the foil, whereupon it is brought into contact with an etching material. In this case V-shaped grooves may also be formed in the foil. It is also possible, by etching, to fit irregular or 2-dimensional structures in order to achieve the same effect.

However, it is necessary, using these techniques, to process the metal foil further after manufacture in order to obtain the desired structure on the surface.

Publication JP 2001206798 describes a device with which metal panels can be produced which are formed by means of a foil drawing method. A rotary substrate is used on which crystallisation of silicon takes place. The surface of the substrate may be unmachined, whereby the metal panels produced on a surface are given a saw tooth structure, for example. This enlarges the effective area, resulting in improved efficiency in solar cells.

The foil drawing method is ideal for producing very thin foils. Foils can be produced with a thickness of less than 250 µm. The major advantage of this method is that the quantity of silicon per panel, for example a solar cell, is very limited. A disadvantage of the very thin metal panels is that they can easily break. This risk is real, particularly in the further production of solar cells.

SUMMARY OF THE INVENTION

An object of this invention is to produce thin metal panels by means of a foil drawing method in which the panels are manufactured so that they are stronger than panels manufactured by methods of prior art. This object is achieved by a method such as that mentioned in the introduction, characterised in that the substrate comprises at least one second groove that is dimensioned so that it is substantially filled with the liquid metal, reinforcements being formed in the location in the at least one second groove on the metal panel.

Reinforcements are fabricated in the metal panels by providing one or more second grooves in the substrate. These reinforcements strengthen a panel as a whole, whilst the remainder of the panel may remain thin.

In one embodiment the metal panels have an average thickness of between 100 and 350 µm over the entire surface, except for the reinforcements.

The at least one second groove preferably has a depth of between 50 and 500 µm.

In one embodiment the at least one second groove has a width of between 2 and 5 mm.

In a further embodiment the at least one second groove has a base which runs substantially parallel to a top surface of a metal panel.

In a further embodiment the substrate comprises at least one of the recesses and elevations of the surface of the substrate, so that the same pattern is formed on a surface in the metal panels. The recesses may have such a depth, width and angle of lateral wall inclination that the recesses are filled with some of the liquid metal. On the contrary, it is also possible for the recesses to have such a depth and width that the recesses are bridged by crystallised metal.

In a specific embodiment a cross-section of a first number of grooves is so large that the first number of grooves is filled with the liquid metal, and a cross-section of a second number of grooves is so large that the second number of grooves is not filled by the liquid metal. The first number of grooves may be so deep that this forms elevations in the foil which serve as metal contacts after treatment by a roller printing method, for example.

The recesses are preferably narrower than 1 mm. Such thin grooves in the substrate are bridged by the metal during crystallisation. Using this method very thin foils can be produced which comprise on one side V-shaped parallel grooves, for example, enabling the effective area of a solar cell to be increased. This larger surface in turn provides improved optical properties, resulting in an increase in efficiency of the solar cell.

In one embodiment of the invention the recesses comprise cavities of such dimensions that holes are formed in the foil at the points where the holes on the substrate are located. The holes thus formed may, for example, be used in a subsequent step in which metal contacts on the front and back of the foil are connected. Here making these holes specially, using a laser for example, is no longer necessary. The holes preferably have a width of between 1 mm and 2 mm.

In another embodiment the elevations comprise bands. These bands are elevations on the substrate of a certain length. They may be straight, but also curved. In a special embodiment a cross-section of the bands assumes a zigzag shape. This specific zigzag shape may be used to copy, as it were, a zigzag structure in the foil. This may also in turn increase the efficiency of a solar cell.

The invention also relates to a metal panel produced by the above-mentioned method, and to a device for producing metal panels as described below.

BRIEF DESCRIPTION OF THE DRAWING FIGURES

Further advantages and features of this invention will be explained in detail with reference to a description of individual embodiments, reference being made to the attached drawings, in which FIG. 1 shows a diagrammatic side view of a device according to an embodiment of the invention;

DETAILED DESCRIPTION OF THE INVENTION

Figure 1:
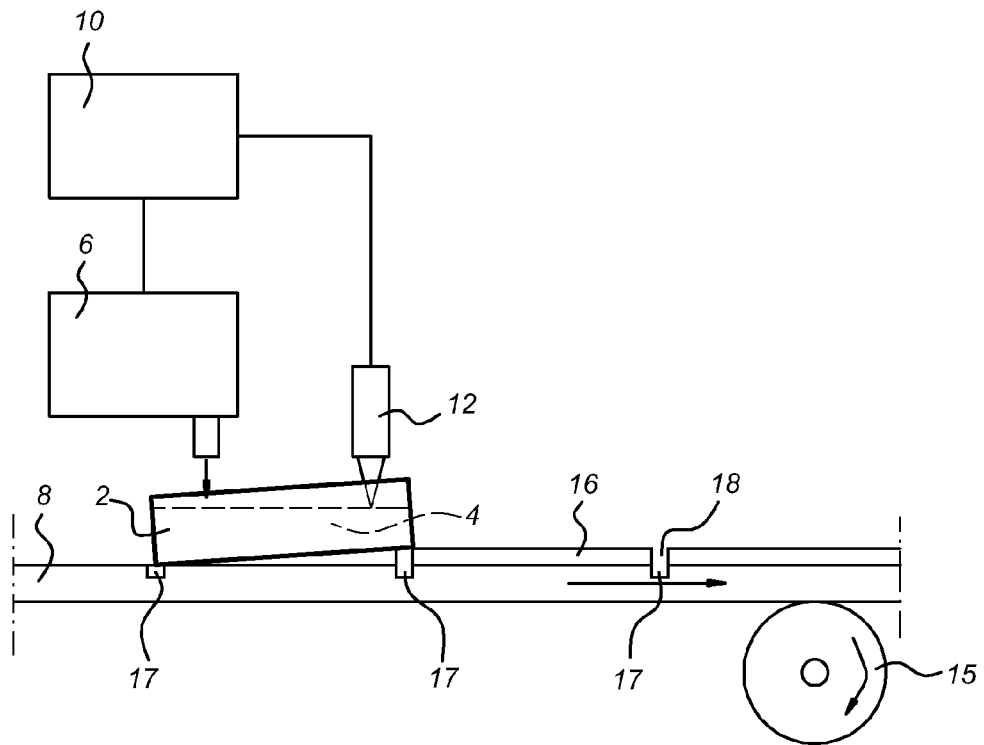

FIG. 1 shows a diagrammatic side view of a foil drawing device according to an embodiment of this invention. The device for producing metal foils consists of a casting frame 2 into which a liquid metal, such as silicon, can be poured. The liquid metal 4, also called metal melt 4, is poured into casting frame 2 by means of a feeding device 6. Underneath casting frame 2 there is a substrate 8 in the form of a substrate band 8, which is designed to move underneath casting frame 2 at a certain speed. The driving means required for this are shown in FIG. 1 and denoted by reference number 15. The foil drawing device also comprises a control module 10 and an altimeter 12, arranged to determine the height of liquid metal 4 in casting frame 2. The temperature of substrate band 8 is adjusted so that liquid metal 4 crystallises on the surface with substrate band 8. A typical temperature for liquid silicon is 1200° C. Because substrate band 8 moves, to the right in FIG. 1, a foil 16 will escape on a downstream side of casting frame 2. This foil 16 forces up casting frame 2 on the downstream side, causing the casting frame to tilt slightly. Grooves 17 are provided in substrate band 8 perpendicular to the direction of movement at regular intervals. These grooves 17 have such a width and depth that because of the surface tension of liquid metal 4 it does not run in these grooves 17 and interruptions 18 may occur in metal foil 16. This enables rectangular foils to be produced very simply which are suitable for solar cells. The rectangular foils will cool and eventually shrink slightly. They will therefore become detached from substrate band 8. They can then be removed from substrate band 8 by means of a robot arm, for example, for further processing.

Figure 2:
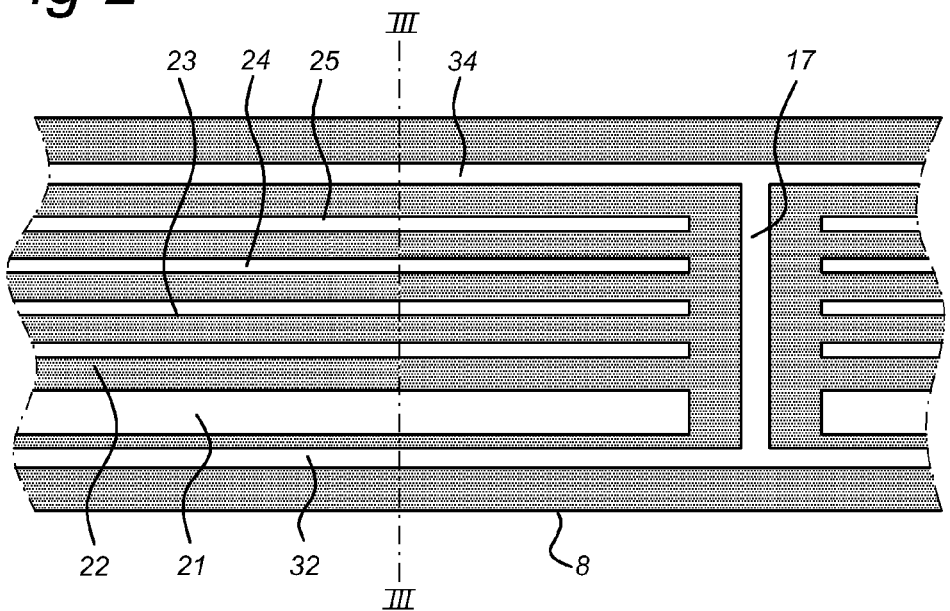
FIG. 2 shows an elevation of the substrate according to an embodiment.

FIG. 2 shows a top view of substrate band 8 according to the embodiment of the invention. Substrate 8 comprises a groove 21 with a width of 3 mm, for example. This groove 21 is of such a size that it is filled by the liquid silicon. Substrate band 8 also comprises a pattern of recesses 22, 23, 24, 25 in the longitudinal direction of substrate band 8. Relatively wide grooves 32, 34 are also provided in the longitudinal direction on both sides of substrate band 8. Grooves 32, 34, and also 17, are disclosed, among other things, in publication EP 0 497 148 and determine the dimension of the (pieces of) foil 16. The shape and depth of grooves 32, 34 are such that liquid metal 4 does not reach grooves 32 and 34 because of the surface tension. Liquid metal 4 cannot reach the other (out) side of grooves 32 and 34 either because casting frame 2 has such dimensions that metal melt 4 only makes contact with substrate band 8 inside (or slightly above the edges of) groove 32 and groove 34.

Figure 3:
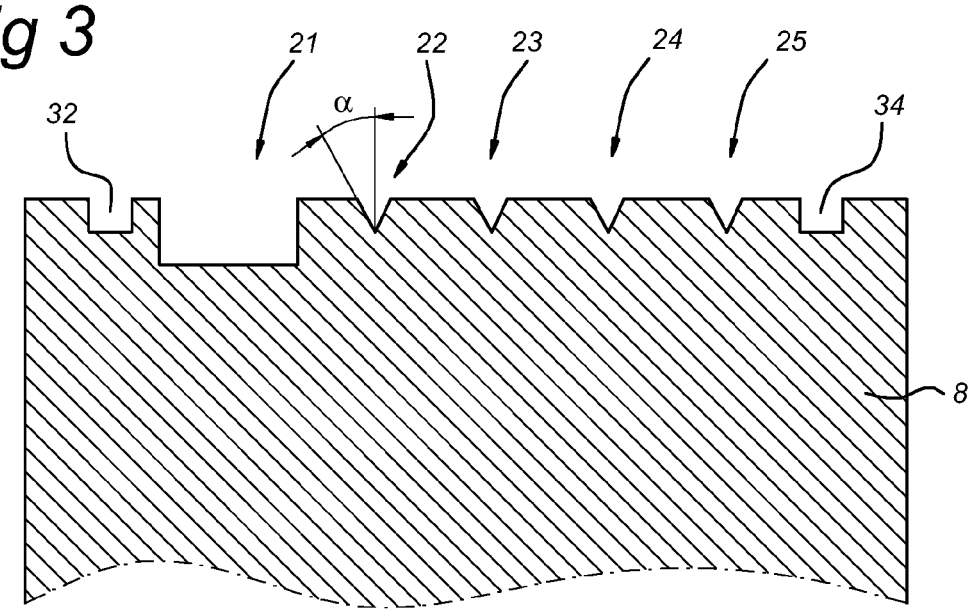
FIG. 3 shows a cross-section through the substrate in FIG. 2.
Figure 4:
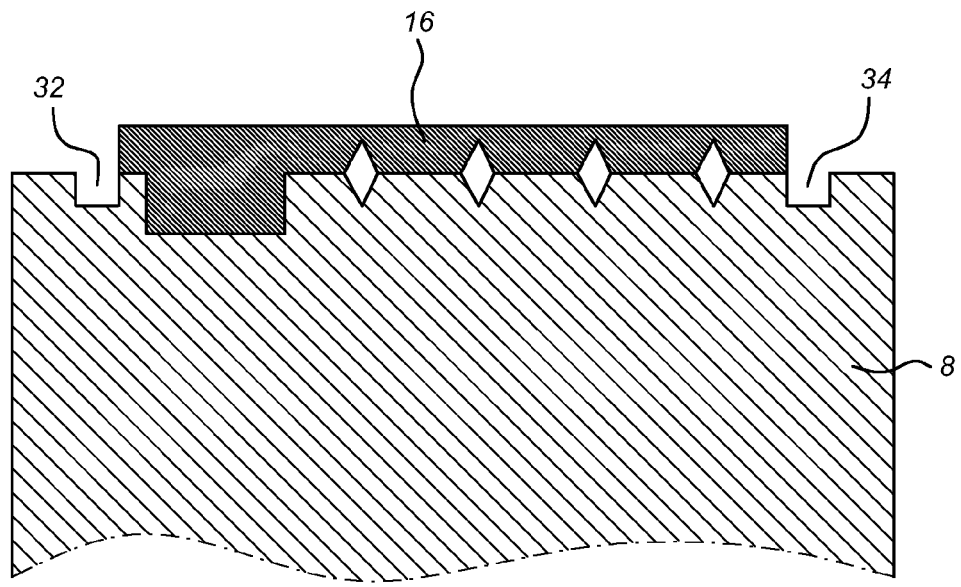
FIG. 4 shows a cross-section through the substrate and a foil formed.

FIG. 3 shows a cross-section through substrate band 8 in FIG. 2. In this example recesses 22, 23, 24, 25 are V-shaped grooves. The width of recesses 22, 23, 24, 25 and the angle of inclination of the lateral walls are such that the liquid metal, silicon for example, does not crystallise in the grooves. Instead the metal forms a bridge over the grooves. This is shown in FIG. 4, the foil being denoted by 16. However, groove 21 is filled with silicon. After crystallisation a thickening of the metal panel will form at this point. This thickening reinforces the metal panel as a whole. It may therefore be correctly referred to as a reinforcement. In FIG. 2 groove 21 runs parallel to one edge of substrate band 8. The orientation of groove 21 and also of recesses 22, 23, 24, 25 may also be different, for example they may be at an angle to the edge of substrate band 8. It is also possible for groove 21 to have a different length from that of recesses 22, 23, 24, 25.

FIGS. 2-4 show only four narrow grooves for the sake of simplicity. This number may be considerably larger, e.g. over 1000. Typical values for the width of grooves 21-25 in this embodiment is 0.1-1 mm. The lateral wall inclination angle α, see FIG. 3, is typically smaller than 20°. In the figures the relative width of groove 21 is not correctly reproduced. Typical values for this groove are between 2 and 5 mm.

In another embodiment substrate 8 comprises recesses which have such a depth, width and lateral wall inclination angle α that the liquid metal fills the recesses. If lateral wall inclination angle α is relatively large in respect to the dimensions of the recesses, the liquid metal will fill the recess. In that case, foil 16 will not be provided with grooves but with protuberances instead, such as bars or strips. It is also possible for the recesses in substrate 8 to be completely local, e.g. a small round cavity, giving foil 16 a knob. This knob may be used for marking for conveyor systems.

Figure 5:
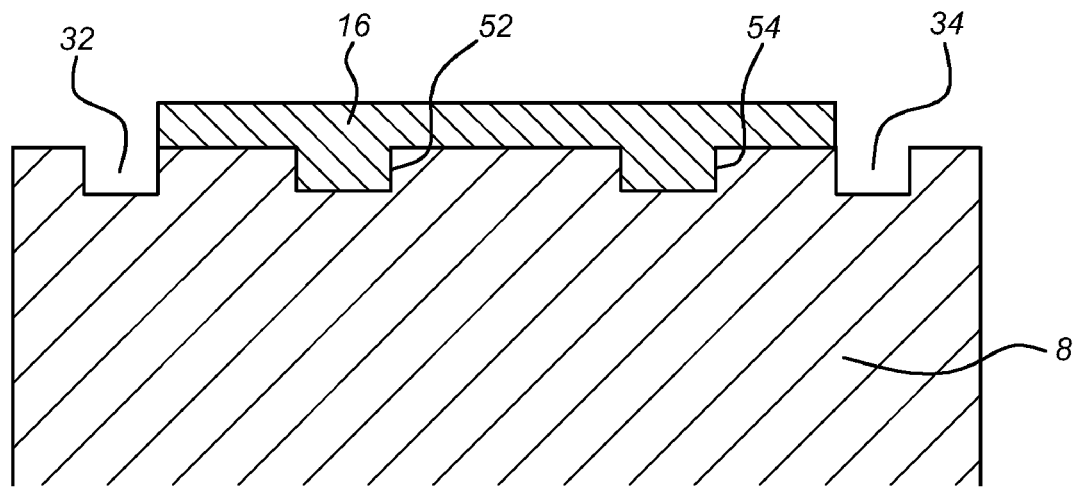
FIG. 5 shows a cross-section through a substrate and a panel formed on it according to another embodiment.
Figure 6:
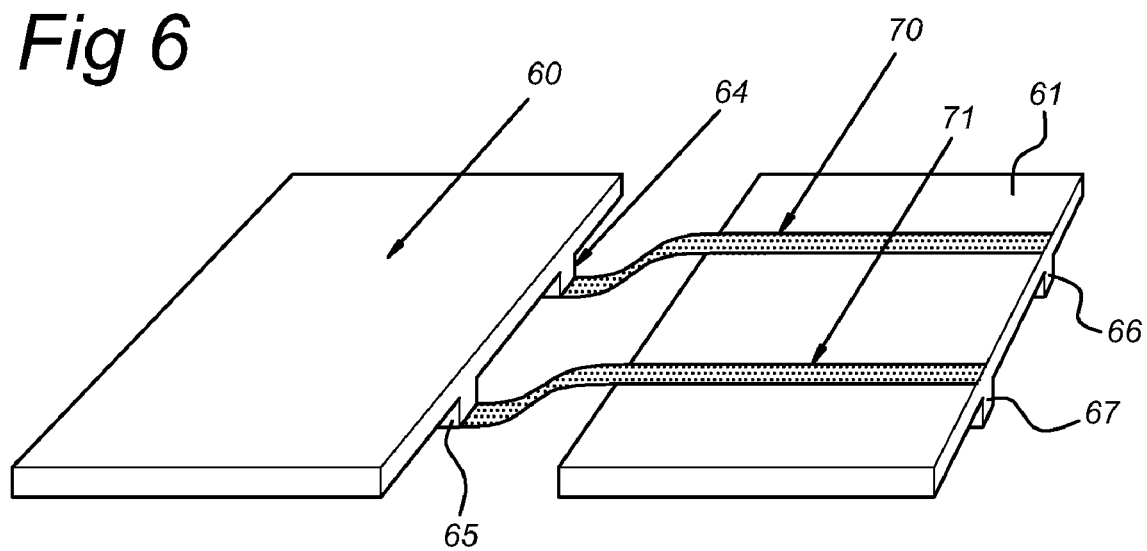
FIG. 6 shows two solar cells which have been produced by the method according to the embodiment and which are connected to each other.

FIG. 5 shows an embodiment in which substrate 8 comprises two grooves 52, 54. The angle of inclination α of grooves 52, 54 is almost 0°. However, these grooves 52, 54 are so wide that the liquid metal fills grooves 52, 54. A typical width of grooves 52, 54 is 2-5 mm. A typical depth of grooves 52, 54 is 0.2-2 mm. It is noted here that angle of inclination α may have a higher value than 0-45°, for example. FIG. 6 shows two solar cells 60, 61 which are produced with a substrate such as that shown in FIG. 5. Reinforcements 64, 65 of solar cell 60 and reinforcements 66, 67 of solar cell 61 are used here for strengthening in locations where metal connections are fitted on the top of the solar cell ('bus bars'). Reinforcement 64 is connected by a metal joint 70 to the front of a solar cell at the points where it has a reinforcement 66. Reinforcement 65 is connected by another metal joint to the front on reinforcement 67, thereby connecting solar cells 60 and 61 electrically to each other. This connection is typical of the connection of solar cells. When solar cells are connected considerable forces are generated which result in the breakage of thin cells. These forces are transmitted mainly via metal joints 70, 71 to solar cells 60, 61. Because reinforcements 64, 65, 66, 67 are provided underneath the points of adhesion of joints 70, 71, the tin solar cells 60, 61 provide better resistance to the forces generated.

Figure 7:
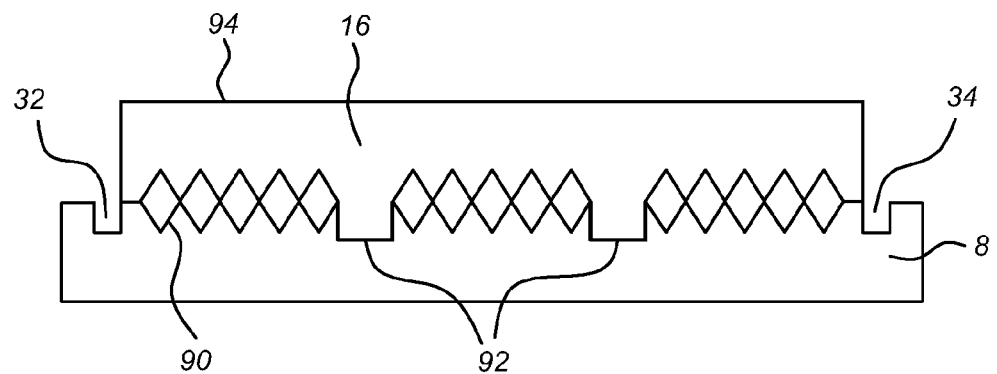
FIG. 7 shows a cross-section through a substrate and a panel formed according to a further embodiment of the method.
Figure 8:
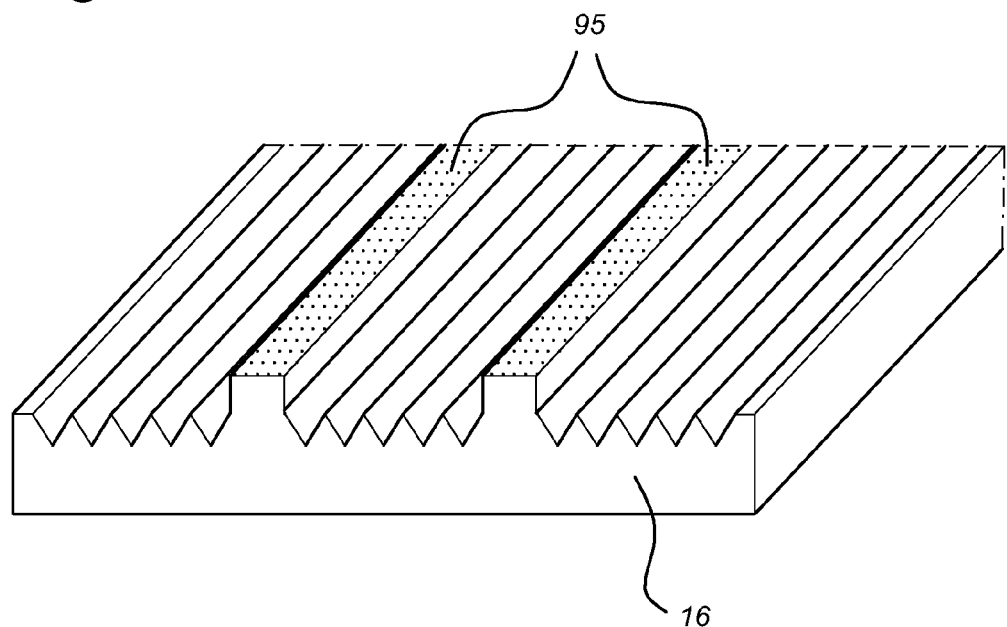
FIG. 8 shows a perspective view of the foil formed in FIG. 7.

FIG. 7 shows a cross-section through substrate 8 and film 16 formed, according to a further embodiment of the method. Substrate 8 comprises a number of parallel grooves 90 on the surface of substrate 8. The grooves are so narrow that the liquid silicon does not crystallise in the grooves, i.e. 'bridging'. Substrate 8 also comprises a number of recesses 92 which are filled b the silicon. Recesses 92 have a base which runs substantially parallel to upper surface 94 of crystallised foil 16. FIG. 8 shows a perspective view of the foil formed in FIG. 7. It can be seen in FIG. 8 that foil 16 has been given a zigzag surface, from above which project a number of elevations 95. These elevations 95 may then be provided with a metal layer by known printing methods such as roller printing. This gives rise, in a relatively simple manner, to metal contacts which can serve to connect the solar cell.

Figure 9:
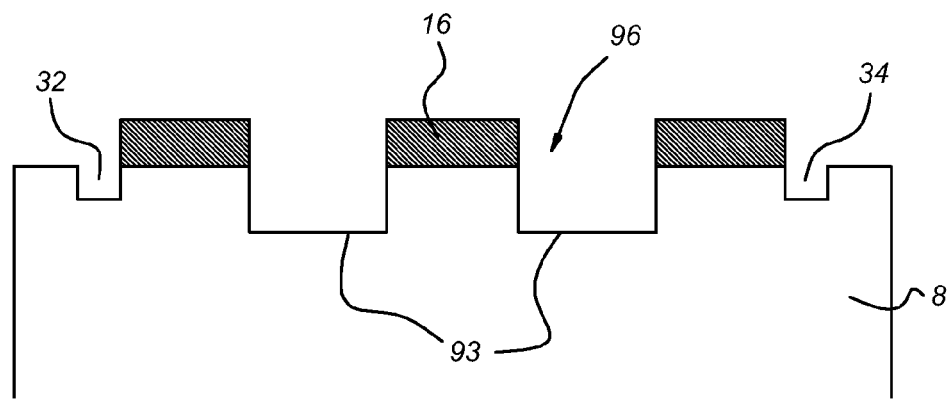
FIG. 9 shows a section through a substrate and a panel formed according to an embodiment.
Figure 10:
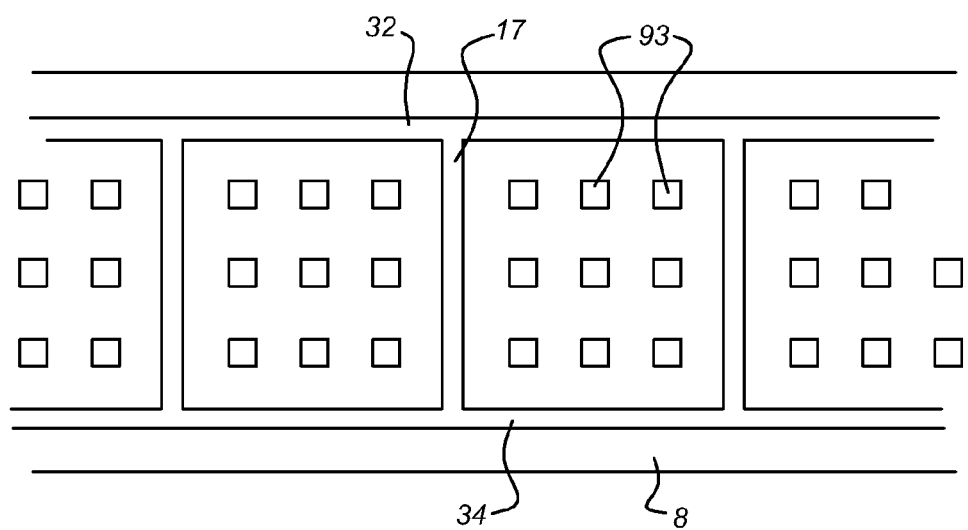
FIG. 10 shows an elevation of the substrate in FIG. 9.

FIG. 9 shows a cross-section through substrate band 8, with a number of cavities 93 which have such a dimension and angle of inclination that they are not filled with metal. This gives rise locally to holes in the metal panel. Here the term 'hole' refers to a passage. These holes may be round, but may also have any shape, e.g. rectangular. These holes may be used in a subsequent process step in which metal contacts are connected to the front and rear sides of foil 16. Here the special production of these holes with a laser, for example, is no longer necessary. The holes preferably have a width of between 1 mm and 2 mm. The length, if it is to be defined, depends on the application. The above-mentioned holes may also be made by installing on the surface of substrate 8 elevations which are so high that they project through foil 16. FIG. 10 shows an elevation of the embodiment in FIG. 9. It can be see that each metal panel is provided with some nine holes. FIG. 10 shows cavities 93 organised in a matrix. Other arrangements and numbers are possible, depending on the application of the metal panels.

Figure 11:
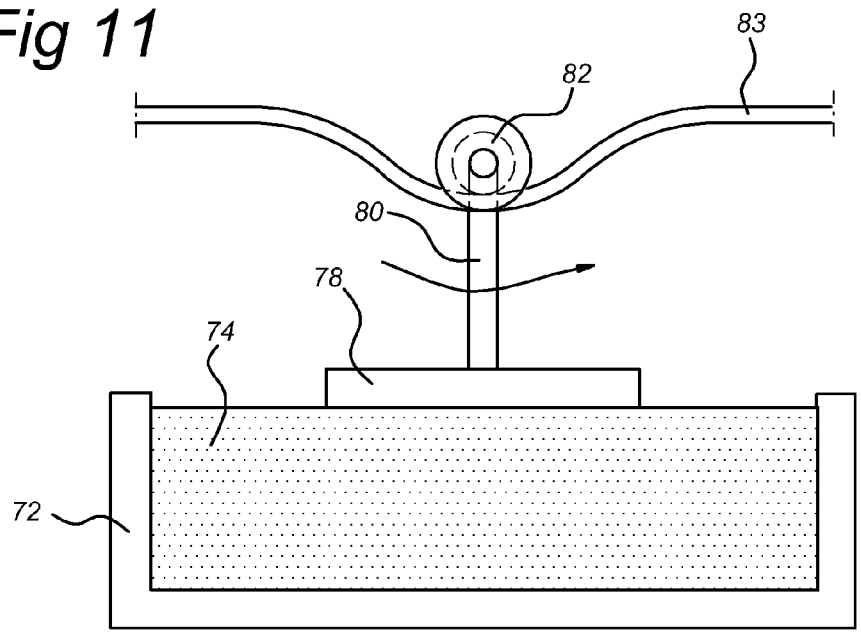
FIG. 11 shows a diagrammatic side view of a device according to another embodiment.
Figure 12:
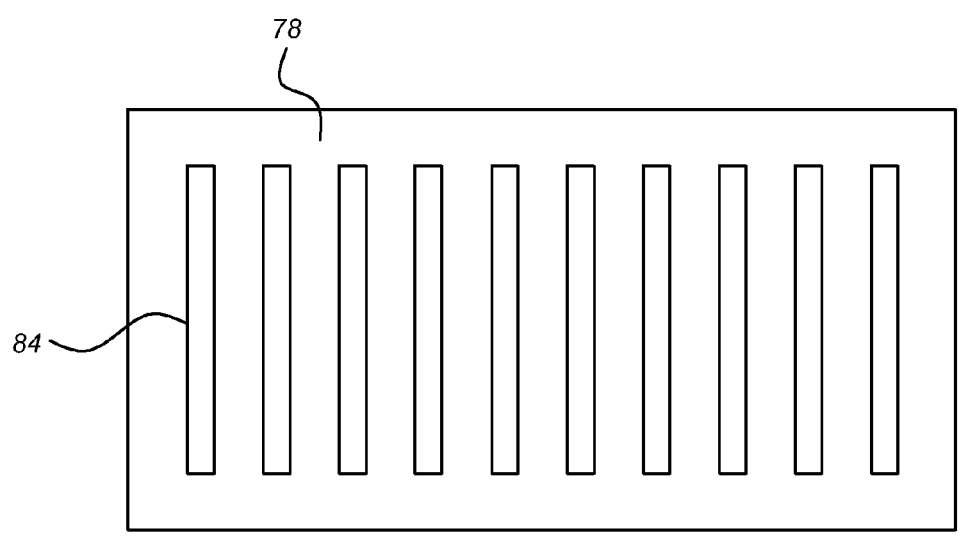
FIG. 12 shows a bottom view of the substrate from FIG. 11.

FIG. 11 shows another embodiment of the invention in which a crucible 72 contains metal melt 74. A substrate 78 is brought into contact with the surface of metal melt 74, see FIG. 9. Substrate 78 is connected to a bar 80, which is moved by driving means 82 so that substrate 78 slides slowly along the surface of metal melt 74. In the example shown in FIG. 11 driving means 82 is guided via a conveyor path 83. Substrate 78 has a temperature that is below the crystallisation temperature of the metal. This produces a thin layer of crystallised metal on substrate 78. Because the substrate is also in turn removed from the surface, a foil of a certain thickness is produced. FIG. 12 shows an example of a bottom view of substrate 78 in FIG. 11. Substrate 78 comprises grooves 84 which have such a width and angle of inclination that liquid metal 74 does not fill these grooves 84. Instead bridges may be formed over these grooves, as already explained with reference to FIG. 4. It is also possible in this embodiment to create elevations instead of recesses in the foil.

Because the foil formed cools it will shrink. This shrinkage ensures that the foil becomes detached from substrate 78.

It should be noted that the pattern in the foil 16 is actually a mirror image of the pattern present on substrate 8.

It should also be noted that panels can also be produced by the method according to the invention which only comprise holes and not reinforcements.

It will be understood that on reading the above variants are easily deductible from the state of the art. Instead of silicon another metal can be used, e.g. a mixture of silicon with germanium or aluminium. It is also possible for substrate 8 on the side of metal melt 4 to be moved, the foils being drawn upwards. Such variants are considered to lie within the scope of the application as described in the attached claims.

The invention claimed is:

1. A method for producing metal panels comprising:
   supplying a metal melt (4) with liquid metal;
   bringing into contact a substrate (8) with said metal melt (4), wherein said substrate (8) comprises one or more first grooves (17) which extend over an entire width of said metal panels to be produced, and wherein said substrate (8) has a lower temperature than said liquid metal, so that some of said liquid metal crystallises on said substrate (8);
   moving said substrate (8) relative to said metal melt (4) so that a metal foil (16) is formed on said substrate (8);
   separating the metal foil from said substrate, wherein said metal foil (16) is divided into metal panels at points where said first grooves (17) are located, wherein the substrate (8) comprises at least one second groove (52, 54; 92) with such dimensions that it is substantially filled by said liquid metal, wherein thickening enforcements are formed on said metal panels in the at least one second groove (52, 54; 92), whilst the remainder of the panels remains thin, the thickening enforcements reinforcing the metal panel as a whole.

2. The method according to claim 1, wherein the metal panels have an average thickness of 100-350 µm over an entire surface, with the exception of said reinforcements.

3. The method according to claim 1, wherein said at least one second groove has a depth of between 50 and 500 µm.

4. The method according to claim 1, wherein said at least one second groove has a width of between 2 and 5 mm.

5. The method according to claim 1, wherein said at least one second groove has a base which runs substantially parallel to an upper surface of a metal panel.

6. The method according to claim 1, wherein the substrate (8) comprises at least one of recesses and elevations (22, 23, 24, 25) of the surface of the substrate (8) so that a same pattern is formed on a surface in the metal panels (16).

7. The method according to claim 6, wherein the recesses have such a depth, width and lateral wall inclination angle that the recesses are filled with some of the liquid metal.

8. The method according to claim 6, wherein the recesses have such a depth and width that the recesses are bridged by crystallised metal.

9. The method according to claim 6, wherein the recesses are narrower than 1 mm.

10. The method according to claim 9, wherein the cavities in one direction have a width of between 1 mm and 2 mm.

11. The method according to claim 10, wherein the strips have a width of between 10 and 50 µm.

12. The method according to claim 6, wherein the recesses comprise cavities (93) with such dimensions that holes are formed in the metal panels at points where the cavities (93) are located on the substrate (8).

13. The method according to claim 6, wherein the elevations comprise strips.

14. The method according to claim 1, wherein a casting frame (2) is filled with the metal melt and wherein the substrate is a substrate band (8) which is moved underneath the casting frame (2).

15. The method according to claim 1, wherein the substrate (78) on a surface of the metal melt (74) is brought into contact with the metal melt (74), and is guided away from it.

16. The method according to claim 1, wherein the metal is silicon.

17. The method according to claim 1, wherein the metal is either a mixture of silicon and germanium or a mixture of silicon and aluminium.

18. A device for producing metal panels comprising:
    a crucible (4; 74) arranged to heat a metal melt with liquid metal;
    a substrate (8; 78) comprising one or more first grooves (17) which extend over an entire width of the metal panels to be produced, wherein said substrate (8) has a lower temperature, at least in operation, than the liquid metal, so that some of the liquid metal crystallises on the substrate (8);

driving means arranged to bring said substrate (8) into contact with said metal melt and arranged to move said substrate (8) relative to said metal melt so that a metal foil is formed on said substrate (8), wherein said metal foil (16) is divided into metal panels at points where said first grooves (17) are located, wherein said substrate (8) comprises at least one second groove (52, 54; 92) with such dimensions that it is substantially filled by said liquid metal, wherein thickening enforcements are formed on said metal panels in the at least one second groove (52, 54; 92), whilst the remainder of the panels remains thin, the thickening enforcements reinforcing the metal panel as a whole.

19. A method for producing metal panels, comprising:

supplying a metal melt (4) with liquid metal; bringing into contact a substrate (8) with said metal melt (4), wherein said substrate (8) comprises one or more first grooves (17) which extend over an entire width of the metal panels to be produced, and wherein said substrate (8) has a lower temperature than said liquid metal, so that some of said liquid metal crystallises on said substrate (8);

moving said substrate (8) relative to said metal melt (4) so that a metal foil (16) is formed on said substrate (8);

separating said metal foil from said substrate, wherein said metal foil is divided into metal panels at points where said first grooves (17) are located, wherein said substrate (8) comprises at least one recess (93) with such dimensions that no crystallisation of said liquid metal takes place in said at least one recess, as a result of which holes are formed locally in said metal panels.

20. The method according to claim 19, wherein the metal is silicon.

21. The method according to claim 19, wherein the metal is either a mixture of silicon and germanium or a mixture of silicon and aluminium.

22. A device for producing metal panels comprising:

a crucible (4; 74) arranged to heat a metal melt with liquid metal; a substrate (8; 78) comprising one or more first grooves (17) which extend over an entire width of said metal panels to be produced, wherein said substrate (8) has a lower temperature, at least in operation, than said liquid metal, so that some of said liquid metal crystallises on said substrate (8);

driving means arranged to bring the substrate (8) into contact with the metal melt and arranged to move the substrate (8) relative to the metal melt so that a metal foil is formed on said substrate (8), wherein said metal foil (16) is divided into metal panels at points where said first grooves (17) are located, wherein said substrate (8) comprises at least one recess (93) with such dimensions that no crystallisation of said liquid metal takes place in said at least one recess, as a result of which holes are formed locally in said metal panels.

* * * * *